United States Patent [19]

Crimmins

[11] 4,090,667

[45] May 23, 1978

[54] UNIVERSALLY PROGRAMMABLE SHORTING PLUG FOR AN INTEGRATED CIRCUIT SOCKET

[75] Inventor: David J. Crimmins, Stockton, N.J.

[73] Assignee: Aries Electronics, Inc., Frenchtown, N.J.

[21] Appl. No.: 796,554

[22] Filed: May 13, 1977

[51] Int. Cl.² .......................................... H01R 31/08
[52] U.S. Cl. .................................................... 339/19
[58] Field of Search .................... 339/18 R, 18 C, 19, 339/31, 32, 33, 222

[56] References Cited

U.S. PATENT DOCUMENTS

| | | | |
|---|---|---|---|
| 2,032,980 | 3/1936 | Fitzgerald | 339/31 M |
| 3,054,078 | 9/1962 | Basehkin | 339/19 |
| 3,731,254 | 5/1973 | Key | 339/19 |
| 3,905,667 | 9/1975 | Crimmins | 339/19 |
| 4,019,094 | 4/1977 | Dinger | 339/19 |
| 4,030,793 | 6/1977 | Hanlon | 339/19 |

FOREIGN PATENT DOCUMENTS 2,152,452  4/1973  Germany ........................... 339/18 C Primary Examiner—Neil Abrams
Attorney, Agent, or Firm—Anthony J. Casella

[57] ABSTRACT

A shorting plug for selectively interconnecting contacts of an integrated circuit socket includes a housing for supporting a terminal pin assembly including a plurality of terminal pins corresponding to the number of contacts of the integrated circuit socket, with the terminal pins being electrically shorted together by electrically conductive bridges. Each bridge includes a removable portion that is partially pre-sheared so as to enable the removable portion to be broken out to arrange the paths of electricity in the terminal pin assembly in any desired pattern.

10 Claims, 6 Drawing Figures

U.S.Patent  May 23, 1978  4,090,667

UNIVERSALLY PROGRAMMABLE SHORTING PLUG FOR AN INTEGRATED CIRCUIT SOCKET

BACKGROUND OF THE INVENTION

This invention relates to a shorting plug for selectively interconnecting contacts of an integrated circuit socket, and more particularly, a universally programmable shorting plug for establishing any desired electrical path or paths between the several contacts of the integrated circuit socket.

Miniturized circuits have been in use for some time and are employed on a ever-increasing scale in complex electronic equipment. The practices in the technology have evolved such that is is now common practice to use what has become known as integrated circuits, or physically small units containing an entire circuit (rather than a single electrical terminal), and to mount these integrated circuit packs or units to printed circuit boards and the like. It was early practice to solder the electrical contacts or terminals of these integrated circuits directly to points on the integrated circuit boards. In other cases, the electronic packs were mounted directly to a dielectric board with terminals extending through the board for connection to other conductors.

Through a gradual evolutionary use of these techniques, it is now more common and desirable to mount electronic integrated circuit units to a terminal board or printed circuit board for easy removal and easy exchanging of individual units. Accordingly, sockets are now often provided for receiving the pins (contacts) of the integrated circuit pack. These sockets generally include a dielectric housing supporting electrical contacts for receiving the pins of the integrated circuit packs, the contacts having long pins, or posts, extending from the lower part of the housing for insertion through holes in the printed circuit board. When the socket is mounted in place on the circuit board, the terminal post extends to the backside of the printed circuit board, providing posts for receiving a wrapped wire or other common type of conductor connection for joining the integrated circuit to other components on the same or other circuit boards.

During the assembly of a printed circuit board including sockets and integrated circuit packs, it is often desirable to conduct preliminary tests. For certain tests it is often necessary to effect the shorting of certain contacts of the various sockets in the circuit board assembly. Realizing the size of the miniturized elements in a circuit board, it is apparent that a single shorting plug for interconnecting only two contacts of an integrated socket is of very small size, and not readily manually manipulated. Furthermore, when the shorting plug is removed, and placed at a location near the technician's station, it often happens that the shorting plug becomes dirty, misplaced, etc. In order to overcome the deficiences of prior art shorting plugs utilized for interconnecting two contacts of an integrated circuit socket, applicant has developed the new and improved shorting plug which is the subject matter of U.S. Pat. No. 3,905,667 which issued on Sept. 16, 1975 to David J. Crimmins and William Y. Sinclair and is assigned to the assignee of the subject application, and is entitled "SHORTING PLUG FOR AN INTEGRATED CIRCUIT SOCKET".

For those preliminary tests wherein it is necessary to effect the shorting of numerous contacts of the various sockets to establish any desired electrical path or paths in the circuit board assembly, it has heretofore been the practice in the industry to solder discrete wires to the several contacts of the integrated circuit socket. Again realizing the minturized construction of the integrated circuit socket, the technique of soldering wires is a complicated procedure, is costly because of the time consumed in the hand wiring operation, and because of the miniturization possibly results in open circuits, thereby affecting the electrical test results.

Of course, as indicated above, although the shorting plug of U.S. Pat. No. 3,905,667 may be efficiently employed in applications wherein it is desired to interconnect only two, usually opposed, contacts, it is apparent that in those preliminary tests wherein it is required to effect multiple shorting between three or more contacts, or between contacts which are not in opposed relationship, the shorting plug of the prior art cannot be effectively employed. Thus, as indicated above, the industry has resorted to the technique of soldering wires, thereby resulting in a costly, inefficient, and unreliable interconnect arrangement.

Accordingly, there are several attributes considered desireable in a shorting plug for an integrated circuit socket including: providing a device which is universally programmable to achieve any desired electrical path or paths required for the testing of the circuit board assembly; means for effecting in an inexpensive manner the desired programming of the shorting plug to achieve the desired electrical path or paths; and a shorting plug which is relatively inexpensive to manufacture and results in a reliable shorting plug for test applications. It is an object of the present invention to provide all of these attributes in a single universally programmable shorting plug, and to this end, to obviate the shortcomings of the prior art devices to satisfy one or more of these requirements.

SUMMARY OF THE INVENTION

In general, these and other objects of the invention are met by a universally programmable shorting plug for an integrated circuit socket, which shorting plug basically comprises a housing having a plurality of spaced, elongated channels extending therethrough and corresponding to the number and disposition of contacts of the integrated circuit socket. A terminal pin assembly having a corresponding plurality of pins is disposed respectively in the housing channels, with each terminal pin having a terminal post extending from the underside of the housing to provide a connection to a corresponding contact of the integrated circuit socket, while an integral portion of each terminal pin extends from the opposite of the housing and is interconnected to adjacent integral portions of pins by strips of electrically conductive bridges. Each bridge includes a removable portion that is off-set with respect to longitudinal axis of the strip forming the bridge. The off-set portion of each bridge may be readily removed by mechanically shearing said off-set portion thereby eliminating the electrically conductive path between said adjacent pins. By selective removal of the off-set portions of the bridges, the terminal pin assembly may be programmed to establish the desired electrical path or paths required for the electrical testing of the integrated circuit board assembly. A suitable cover may be provided for cooperation with the housing to protect the integral portions of the terminal pin assembly after the shorting plug has been programmed.

From the construction of the subject invention, there is achieved the desirable attributes of a universally programmable shorting plug for selectively interconnecting contacts of an integrated circuit socket.

BRIEF DESCRIPTION OF THE DRAWINGS

For a better understanding of the invention, together with further objects and advantages thereof, the following detailed description of a preferred embodiment in the drawings may be referred to in which.

DESCRIPTION OF PREFERRED EMBODIMENTS

Figure 1:
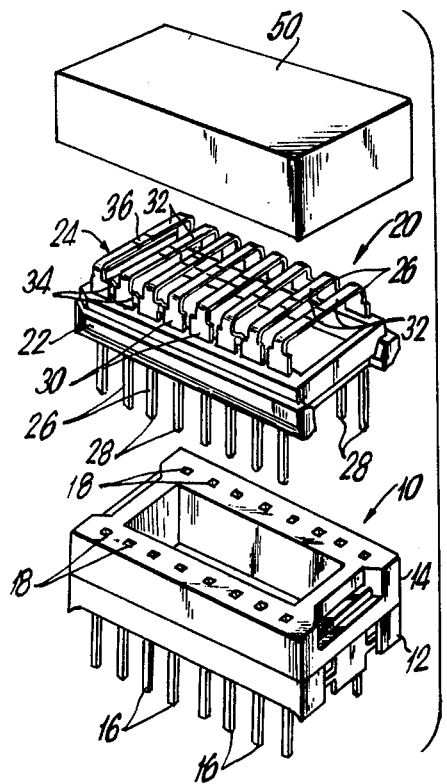
FIG. 1 is an exploded perspective view of the subject universally programmable shorting plug, and an integrated circuit socket.

Referring to FIG. 1, an integrated circuit socket is shown at 10 and includes a base portion 12 and mating upper housing 14. Extending from the lower portion of the integrated circuit socket 10 are a plurality of terminal contacts or pins 16 which include receptacle portions (not shown) disposed within the mating upper housing 14. Openings 18 in the upper surface of upper housing 14 provide access to the receptacle portions of pin 16. Integrated circuit socket 10 is of the type disclosed in U.S. Pat. No. 3,732,529 which issued on May 8, 1973, and is assigned to the assignee of the subject invention. As is readily apparent, the universally programmable shorting plug of the subject invention may likewise by employed with other types of integrated circuit sockets.

Figure 2:
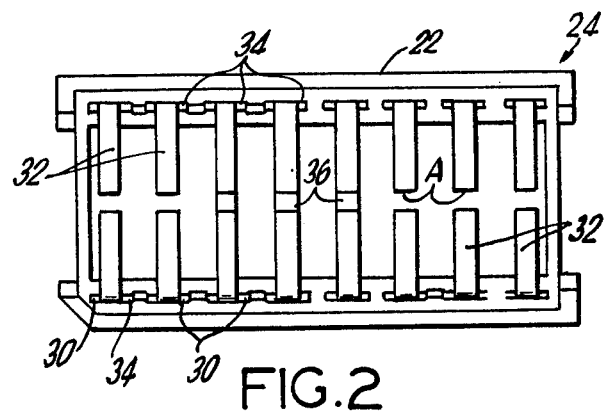
FIG. 2 is a plan view of the universally programmable shorting plug of the subject invention, with selected portions of the terminal pin assembly being removed to establish the desired electrical path or paths.
Figure 4:
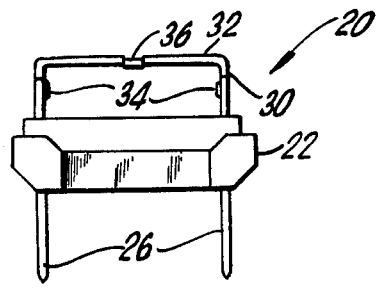
FIG. 4 is a side elevational view of the shorting plug of the universally programmable shorting plug of the subject invention.

In order to selectively interconnect the several contacts of integrated circuit socket 10, the subject universally programmable shorting plug is provided. The shorting plug is designated by the numeral 20 and includes an elongated housing 22 made of an electrically insulating material, such as Nylon, and having a plurality of spaced, elongated channels extending therethrough, respectively corresponding to the number and spacing of the openings 18 of the integrated circuit socket 10. Housing 22 is adapted to receive a terminal pin assembly, generally designated by the numeral 24. The terminal pin assembly includes a corresponding plurality of pins 26, each of which is disposed in a channel of the housing 22 and has a terminal post portion 28 extending from the underside of the housing 22, and an integral portion 30 extending from the opposite or upper portion of the housing 22. As illustrated in FIGS. 1, 2 and 4, the terminal pins 26 are arranged in two parallel rows, with each set of opposed pins bing interconnected by an electrically conductive strip or bridge, designated by the numeral 32. In addition, each pair of adjacent pins, along each row, is electrically interconnected by a bridge designated by the numeral 34. Accordingly, as shown in FIG. 1, the terminal pin assembly, prior to being programmed, results in an arrangement wherein all of the terminal pins 26 are electrically shorted together. Furthermore, the terminal pin assembly 24 is preferably of unitary construction and is made of a relatively thin conductive metal formed in the shape shown from a flat blank. The post portions 28 of the assembly 24 are preferably received in the channels of the housing by an interference fit.

Figure 5:
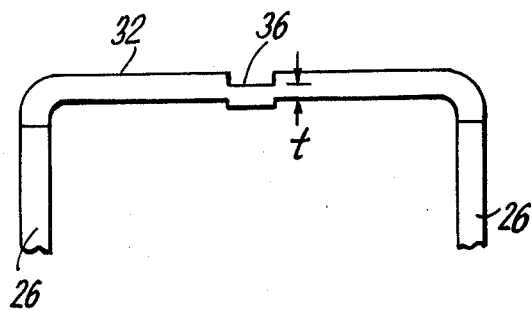
FIG. 5 is a detailed elevational view of a strip of electrically conductive bridge forming a portion of the subject universally programmable shorting plug.
Figure 6:
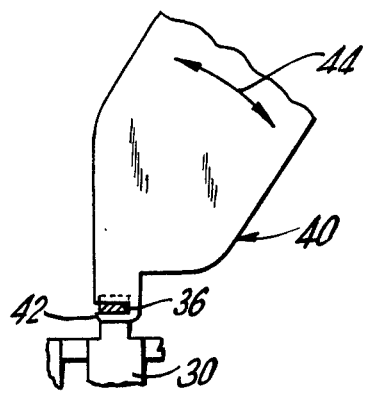
FIG. 6 is a partial sectional view illustrating a tool for removing the removal portion of a strip of electrically conductive bridge of the subject shorting plug.

In order to provide means to achieve the rapid and efficient universal programming of the terminal pin assembly 24, each of the bridges 32 and 34 includes a removable portion that is off-set with respect to the longitudinal axis of the metallic strip forming the bridge. More particularly, reference is made to FIG. 5, wherein a bridge, such as 32 extending between two terminal pins 26, 26 includes at its intermediate portion a removable portion, designated by the numeral 36. In the formation of the terminal pin assembly 24 the central portion of the bridge 32 is partially pre-sheared so as to reduce the thickness of the electrical path as designated as "$t$", and this pre-shear is achieved by partial scoring of the bridge 32. The partial scoring results in an arrangement wherein the connection between the removable portion 36 and the remainder of the bridge 32 is quite strong in tension, but because of its design, is relatively weak in torsion, Stated differently, the vertical displacement of the removable portion 34 by a double straight score, or partial shear, relative to the electrically conductive bridge 32 results in an arrangement wherein the removable portion 36 may be readily removed from the electrically conductive bridge, thereby electrically disconnecting the two pins 26, 26, as shown in FIG. 5. In order to effect removal of the removable portion 36, as shown in FIG. 6, a simple hand tool 40 may be provided including a notched tip 42 of a size corresponding to the thickness of the removable portion 36, and by a simple torsion movement, designated by the numeral 44, the removable portion 36 may be removed.

Figure 3:
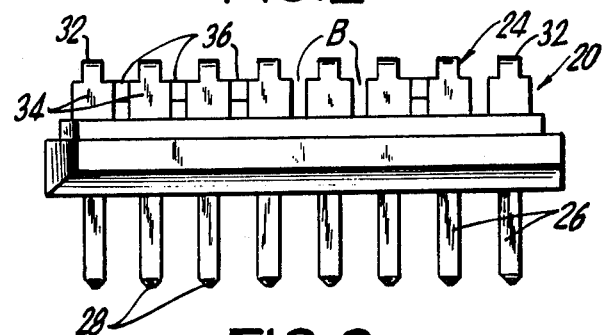
FIG. 3 is a front elevational view of the shorting plug of the subject invention as shown in FIG. 2.

FIG. 2 illustrates a plan view of a terminal pin assembly 24 wherein removable portions of the conductive bridges 32 and conductive bridges 34 are removed. More particularly as shown in FIG. 2, and also in FIG. 3, the letter A designates those removable portions 36 of the bridges 32 wherein the removable portions 34 have been removed. The letter B designated those portions of the bridges 34 wherein the removable portions 36 have been removed. FIG. 4 illustrates an end view of the universally programmable shorting plug 20, and in particular the off-set of the removable portions 34 of the electrically conductive bridges 32 and 34.

In use, it is relatively simple matter for the technician to program the shorting plug 20 by merely using the tool 40 to fit across the desired scored area or removable portion 36, and by a simple rotary movement of the tool sever the pre-scored removable portion to electrically isolate the previously interconnected terminal pins 26, 26. Alternatively, the universal programmable shorting plug 20 may be placed in a simple machine where punches may be programmed to remove the removable portions of the electrically conductive bridges 32 and 34 at desired locations, whereby the shorting plug may be programmed in a single action, rather than being programmed by hand. After the terminal pin assembly has been programmed, a suitable cover, designated by the numeral 50 in FIG. 1 may be provided for enclosing the terminal pin assembly disposed above the housing 22, with the cover 50 being connected to the housing 22 by a friction connection or the like.

In summary, the subject invention provides a new and improved universally programmable shorting plug which initially consists of a complete shorting set of terminal pins set into a plastic platform or housing. The construction of the terminal pin assembly, and more particular the electrically conductive bridges interconnecting adjacent pins is such that with a simple took, partially pre-sheared removable portions of the bridges can be broken out so as to arrange the electrical path or paths in any desired pattern. The terminal pin assembly is configured to include a first set of electrically conductive bridges 32 which are in parallel relationship (see FIG. 2) and respectively interconnect the two rows of opposed terminal pins 26, 26. A second set of electrically conductive bridges 34 interconnects the terminal pins 26 along each row thereof, and as shown in FIG. 4, the first set of bridges 32 and second set of bridges 34, 34 are disposed in orthagonal relationship. This particular arrangement provides sufficient clearance between the removable portions 36 of the first and secons set of bridges 32, 34 to enable the tool 40 to be readily manipulated during the programming operation of the shorting plug.

Although the invention has been described with reference to a preferred embodiment, numerous modifications and variations in form and detail, might occur to those skilled in the art. Accordingly, all such modifications and variations are intended to be included within the scope and spirit of the appended claims.

What is claimed is:

1. A universally programmable shorting plug for selectively interconnecting contacts of an integrated circuit socket comprising:
    a housing having a plurality of spaced, elongated channels extending therethrough; and
    a terminal pin assembly including a corresponding plurality of pins disposed respectively in said channels and each having: (1) a terminal post extending from the underside of the housing to provide a connection to a contact of the integrated circuit socket; and (2) an integral portion extending from the opposite side of the housing and interconnected to adjacent pins by strips of electrically conductive bridges, each bridge including a removable portion that is disposed intermediate the length of the bridge, each removable portion defined at its opposite ends by partial score lines extending across the width of the bridge such that the plane of the removable portion is offset with respect to the plane of the bridge whereby said removable portion may be disengaged from the bridge upon the applicaton of a torsional force thereto.

2. A universally programmable shorting plug for selectively interconnecting contacts of an integrated circuit socket as in claim 1 wherein said housing is formed of a non-conductive plastic material, and said terminal pin assembly is of unitary construction and formed of an electrically conductive metallic material.

3. A universally programmable shorting plug for selectively interconnecting contacts of an integrated circuit socket as in claim 1 wherein said plurality of spaced, elongated channels are arranged in two opposed parallel rows, and wherein the strips of electrically conducted bridges respectively interconnecting the opposed terminal pins are parallel.

4. A universally programmable shorting plug for selectively interconnecting contacts of an integrated circuit socket as in claim 3 wherein the electrically conductive bridges interconnecting adjacent pins disposed in each of said parallel rows are disposed orthagonal to the bridges interconnecting opposed terminal pins.

5. A universally programmable shorting plug for selectively interconnecting contacts of an integrated circuit socket as in claim 1 further including a non-conductive cover which engages said opposite side of the housing to enclose the integral portions of said terminal pin assembly.

6. A universally programmable shorting plug for selectively interconnecting contacts of an integrated circuit socket as in claim 1 wherein said terminal pin assembly is received in the housing by an inteference fit.

7. A universally programmable shorting plug for selectively interconnecting contacts of an integrated circuit socket comprising:
    an elongated housing having two parallel rows of a plurality of spaced, elongated channels extending therethrough; and
    a terminal pin assembly including a corresponding plurality of pins disposed respectively in said two rows of channels, each pin having: (1) a terminal post extending from the underside of the housing to provide a connection to a contact of an integrated circuit socket; and (2) an integral portion extending from the opposite side of the housing and interconnected to adjacent pins by strips of electrically conductive bridges, each bridge including a removable portion that is disposed intermediate the length of the bridge, each removable portion defined at its opposite ends by partial score lines extending across the width of the bridge such that the plane of the removable portion is offset with respect to the plane of the bridge whereby said removable portion may be disengaged from the bridge upon the application of a torsional force thereto, said electrically conductive bridges including a first set of parallel electrically conductive bridges respectively interconnecting opposed pins in said two rows of pins, and a second set of electrically conductive bridges, each of the set of second electrically conductive bridges extending respectively along each row of said two rows of pins.

8. A universally programmable shorting plug for selectively interconnecting contacts of an integrated circuit socket as in claim 7 wherein said first set of electrically conductive bridges extends orthagonal to said second set of electrically conductive bridges.

9. A universally programmable shorting plug for selectively interconnecting contacts of an integrated circuit socket as in claim 7 wherein said terminal pin assembly is of unitary construction and formed of an electrically conductive metallic material.

10. A universally programmable shorting plug for selectively interconnecting contacts of an integrated circuit socket as in claim 7 further including a cover for enclosing the portion of said terminal pin assembly disposed on said opposite side of the housing.

* * * * *